(12) United States Patent
Wang et al.

(10) Patent No.: US 9,458,540 B2
(45) Date of Patent: Oct. 4, 2016

(54) PACKAGE SUBSTRATE AND MANUFACTURING METHOD THEREOF

(71) Applicant: Subtron Technology Co., Ltd., Hsinchu County (TW)

(72) Inventors: Chin-Sheng Wang, Hsinchu County (TW); Chien-Ming Chen, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 51 days.

(21) Appl. No.: 14/685,610

(22) Filed: Apr. 14, 2015

(65) Prior Publication Data

US 2016/0230286 A1 Aug. 11, 2016

(30) Foreign Application Priority Data

Feb. 11, 2015 (TW) .............................. 104104529 A (51) Int. Cl.
*H01L 33/00* (2010.01)
*C23C 18/31* (2006.01)
(Continued)

(52) U.S. Cl.
CPC ............... *C23C 18/31* (2013.01); *B32B 37/12* (2013.01); *B32B 37/14* (2013.01); *B65D 65/40* (2013.01); *B32B 2439/00* (2013.01)

(58) Field of Classification Search
CPC ........... H01L 21/486; H01L 23/36777; H01L 23/49827; H01L 33/642
USPC ......... 206/713; 156/219, 150, 280; 361/748; 174/255; 216/13
See application file for complete search history.

(56) References Cited

U.S. PATENT DOCUMENTS 8,063,492 B2* 11/2011 Su ........................ H01L 24/29
257/777
8,737,081 B2* 5/2014 Chen .................... H05K 9/0084
174/64
(Continued)

FOREIGN PATENT DOCUMENTS

JP 2005051088 2/2005
JP 2006332449 12/2006
(Continued)

OTHER PUBLICATIONS

"Office Action of Taiwan Counterpart Application," issued on Oct. 20, 2015, p. 1-p. 3.
(Continued)

*Primary Examiner* — King M Chu
(74) *Attorney, Agent, or Firm* — Jianq Chyun IP Office (57) ABSTRACT

A manufacturing method of a package substrate is provided. A first base is formed. Metal bumps are formed on the first base by plating. A second base having an upper and a lower surfaces, a core dielectric layer, a first and a second copper foil layers and containing cavities is provided. An adhesive layer is formed on inner walls of the containing cavities. The first and the second bases are laminated so that the metal bumps are disposed inside the containing cavities. A first base is removed. Blind via holes extending from the upper surface to the metal bumps are formed. A conductive material layer is formed on the first and the second copper foil layers, wherein the conductive material layer fills the blind via holes so as to define conductive through via holes. The conductive material layer is patterned to form a first and a second patterned metal layers.

10 Claims, 9 Drawing Sheets

(51) Int. Cl.
*B32B 37/12* (2006.01)
*B32B 37/14* (2006.01)
*B65D 65/40* (2006.01)

(56) References Cited

U.S. PATENT DOCUMENTS

| | | | | |
|---|---|---|---|---|
| 2012/0070684 A1* | 3/2012 | Wang | ................... | C25D 5/10 428/621 |
| 2012/0175044 A1* | 7/2012 | Wang | ................... | C25D 5/10 156/150 |
| 2014/0144677 A1* | 5/2014 | Wang | ................... | H05K 1/0206 174/252 |
| 2014/0224411 A1* | 8/2014 | Chen | ................... | H05K 9/0084 156/219 |
| 2015/0092358 A1* | 4/2015 | Wang | ................... | H05K 3/007 361/748 |
| 2015/0114698 A1* | 4/2015 | Huang | ................... | H05K 1/115 174/257 |
| 2015/0195917 A1* | 7/2015 | Wang | ................... | H01L 33/0079 174/255 |
| 2016/0163614 A1* | 6/2016 | Chen | ................... | H01L 23/34 257/774 |

FOREIGN PATENT DOCUMENTS

| | | |
|---|---|---|
| JP | 2012151473 | 8/2012 |
| JP | 2013135168 | 7/2013 |
| TW | I255001 | 5/2006 |
| TW | I451827 | 9/2014 |

OTHER PUBLICATIONS

"Office Action of Japan Counterpart Application," issued on Jun. 21, 2016, p. 1-p. 3.

* cited by examiner

PACKAGE SUBSTRATE AND MANUFACTURING METHOD THEREOF

CROSS-REFERENCE TO RELATED APPLICATION

This application claims the priority benefit of Taiwan application serial no. 104104529, filed on Feb. 11, 2015. The entirety of the above-mentioned patent application is hereby incorporated by reference herein and made a part of this specification.

BACKGROUND OF THE INVENTION

1. Field of the Invention

The invention generally relates to a substrate structure and a manufacturing method thereof, and more particularly, to a package substrate and a manufacturing method thereof.

2. Description of Related Art

Currently, majority of package substrates embedded with copper bumps have adopted the use of small copper bumps cut from large copper bumps by laser cutting. However, the laser cutting procedure is quite time consuming and requires higher cost, and thus is not suitable for mass production.

SUMMARY OF THE INVENTION

The invention is directed to a package substrate and a manufacturing method thereof, which can effectively lower the manufacturing cost and save the process time.

The manufacturing method of a package substrate of the invention includes the following steps. A first base is formed. A plurality of metal bumps is formed on the first base by plating, wherein the metal bumps expose parts of the first base. A second base is provided, the second base has an upper surface and a lower surface opposite to each other, a core dielectric layer, a first copper foil layer, a second copper foil layer and a plurality of containing cavities. The first copper foil layer and the second copper foil layer are respectively located at two side surfaces of the core dielectric layer that are opposite to each other, and the containing cavities extend from the lower surface and pass through the second copper foil layer and the core dielectric layer to expose parts of the first copper foil layer. An adhesive layer is formed on inner walls of the containing cavities. The first base and the second base are laminated, so as to accommodate the metal bumps in the containing cavities, and the metal bumps are fixed within the containing cavities through the adhesive layer. The first base is removed, wherein a bottom surface of each of the metal bumps substantially flushes with the lower surface of the second base. A plurality of blind via holes extending from the upper surface of the second base to the metal bumps is formed. A conductive material layer is formed on the first copper foil layer and the second copper foil layer, wherein the conductive material layer covers the first copper foil layer, the second copper foil layer and the bottom surfaces of the metal bump, and the conductive material layer fills the blind via holes to define a plurality of conductive through via holes. The conductive material layer is patterned to form a first patterned metal layer and a second patterned metal layer, wherein the first patterned metal layer is located on the first copper foil layer and connected with the conductive through via holes, the second patterned metal layer is located on the second copper foil layer, and the first patterned metal layer and the second patterned metal layer respectively expose parts of the two side surfaces of the core dielectric layer.

In one embodiment of the invention, the step of forming the first base includes: providing a dielectric layer, a first release film, a second release film and a copper layer; laminating the dielectric layer, the first release film, the second release film and the copper layer, wherein the first release film and the second release film are respectively located at two side surfaces of the dielectric layer that are opposite to each other, and the copper layer is located on the first release film; and forming a nickel layer on the copper layer, wherein the nickel layer covers the copper layer to form the first base.

In one embodiment of the invention, the metal bumps are located on the nickel layer and expose parts of the nickel layer.

In one embodiment of the invention, the step of forming the metal bumps includes: forming the metal bumps by plating, exposing, developing and etching, and by using the nickel layer as a plating seed layer.

In one embodiment of the invention, the step of removing the first base includes: separating the first release film from the first metal layer through a peeling procedure; and removing the copper layer and the nickel layer through an etching procedure, so as to expose the bottom surfaces of the metal bumps and the lower surface of the second base.

In one embodiment of the invention, each of the blind via holes is a laser blind via hole.

In one embodiment of the invention, the step of forming the conductive material layer includes: using the first copper foil layer and the second copper foil layer as plating seed layers, so as to form the conductive material layer by plating.

The package substrate of the invention includes a base, an adhesive layer, a plurality of metal bumps, a plurality of conductive through via holes, a first patterned metal layer and a second patterned metal layer. The base has an upper surface and a lower surface opposite to each other, a core dielectric layer, a first copper foil layer, a second copper foil layer and a plurality of containing cavities. The first copper foil layer and the second copper foil layer are respectively located two side surfaces of the core dielectric layer that are opposite to each other, and the containing cavities extend from the lower surface and pass through the second copper foil layer and the core dielectric layer to expose parts of the first copper foil layer. The adhesive layer is disposed on inner walls of the containing cavities. The metal bumps are respectively disposed within the containing cavities, wherein the metal bumps are fixed with in the containing cavities through the adhesive layer, and a bottom surface of each of the metal bumps substantially flushes with the lower surface of the base. The conductive through via holes pass through the first copper foil layer to extend to the metal bumps. The first patterned metal layer covers the first copper foil layer and is connected with the conductive through via holes. The second patterned metal layer covers the second copper foil layer and the bottom surfaces of the metal bumps, wherein the first patterned metal layer and the second patterned metal layer respectively expose parts of the two side surfaces of the core dielectric layer.

In one embodiment of the invention, an upper surface of each of the conductive through via holes substantially flushes with a top surface of the first patterned metal layer.

In one embodiment of the invention, the metal bumps are connected with the corresponding conductive through via holes and the second patterned metal layer.

In view of the above, the invention firstly forms the metal bumps on the first base by plating, and then laminate the first base formed with the metal bumps thereon with the second base having the containing cavities, so as to form a substrate embedded with metal bumps. As compared to the conventional substrates embedded with copper bumps, which requires to laser cut a copper plate into small copper bumps, the manufacturing method of the package substrate provided in the invention can effectively lower the manufacturing cost and save the process time.

In order to make the aforementioned features and advantages of the present invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
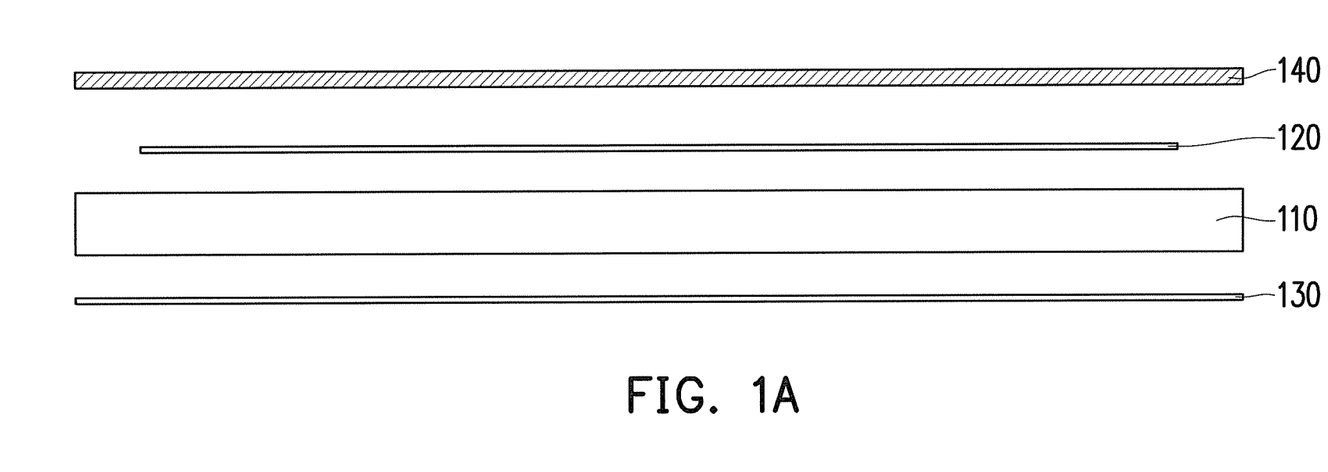
FIG. 1A to FIG. 1P are schematic cross-sectional diagrams illustrating a manufacturing method of a package substrate according to an embodiment of the invention.
Figure 1B:
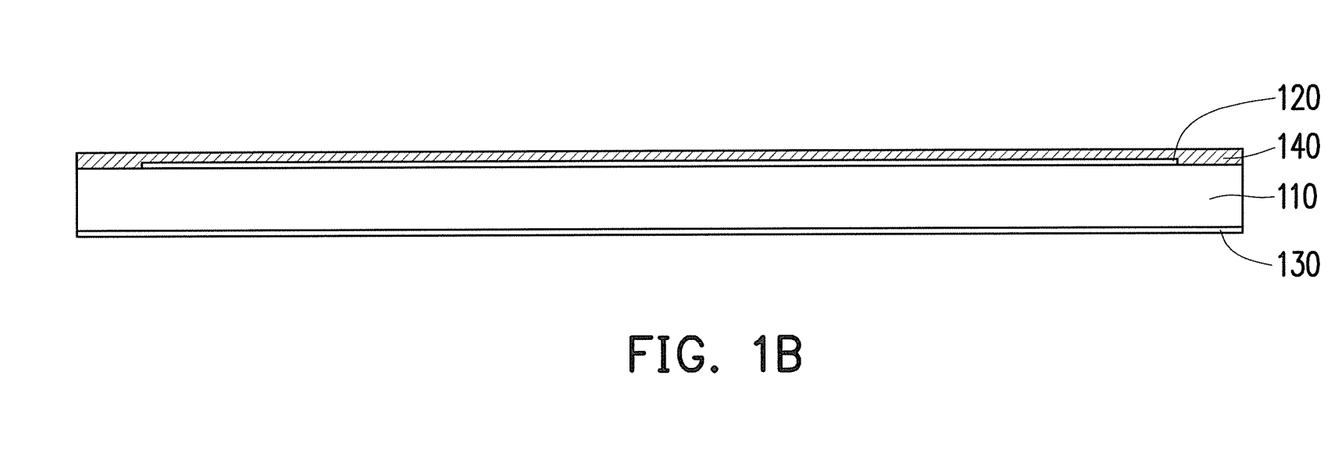
Figure 1C:
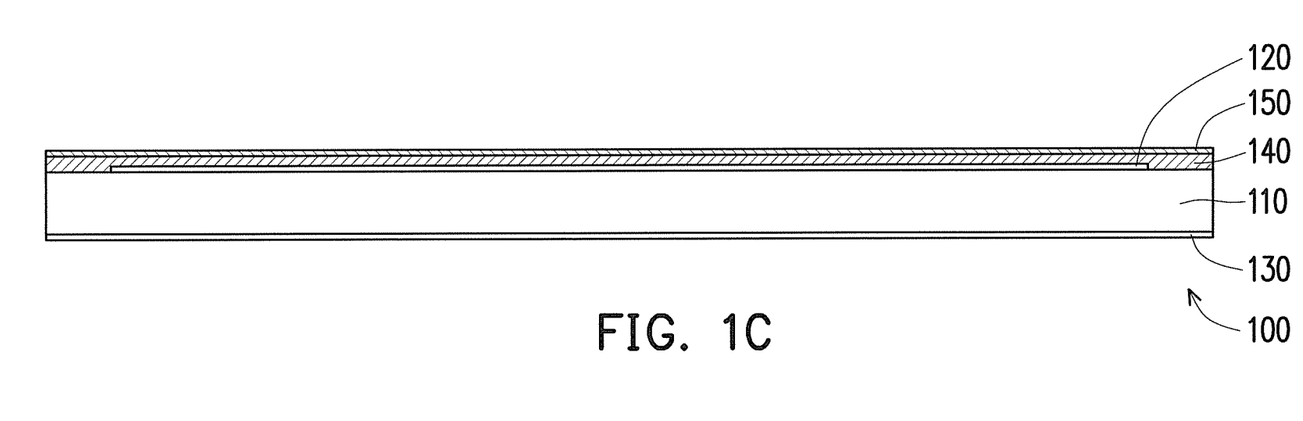
Figure 1D:
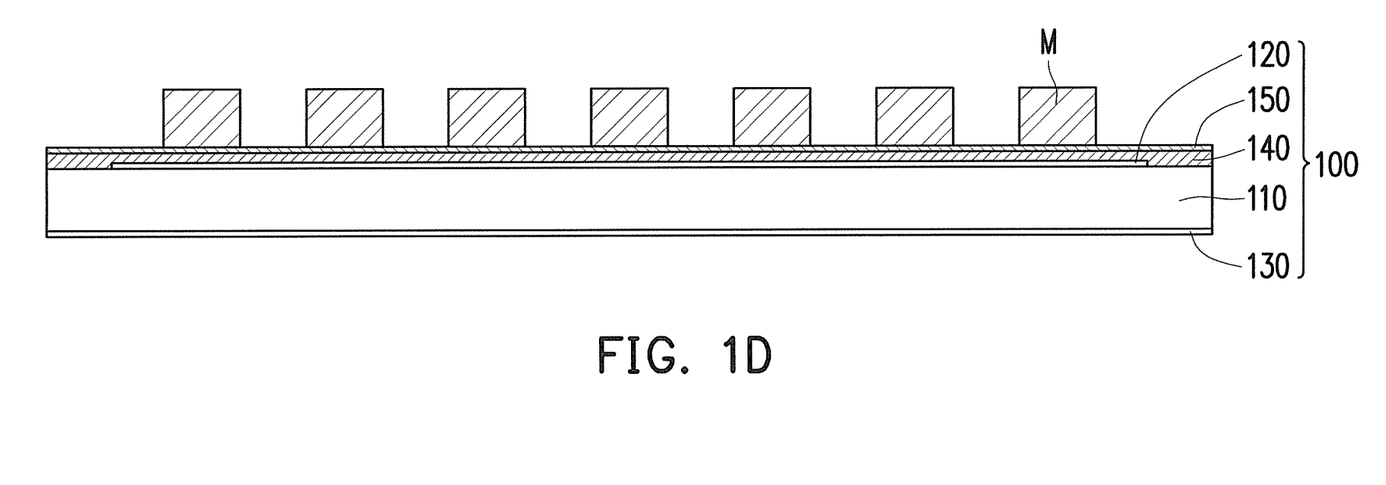
Figure 1E:
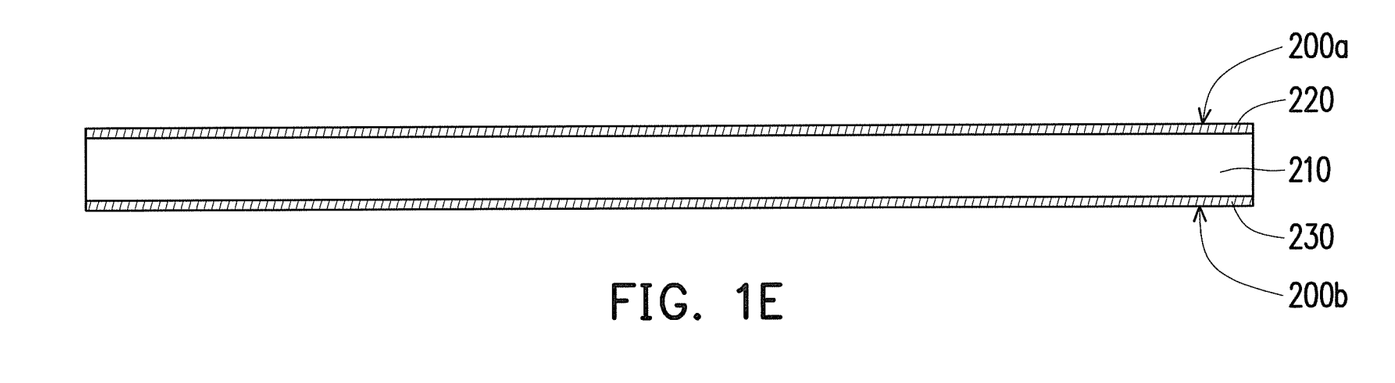
Figure 1F:
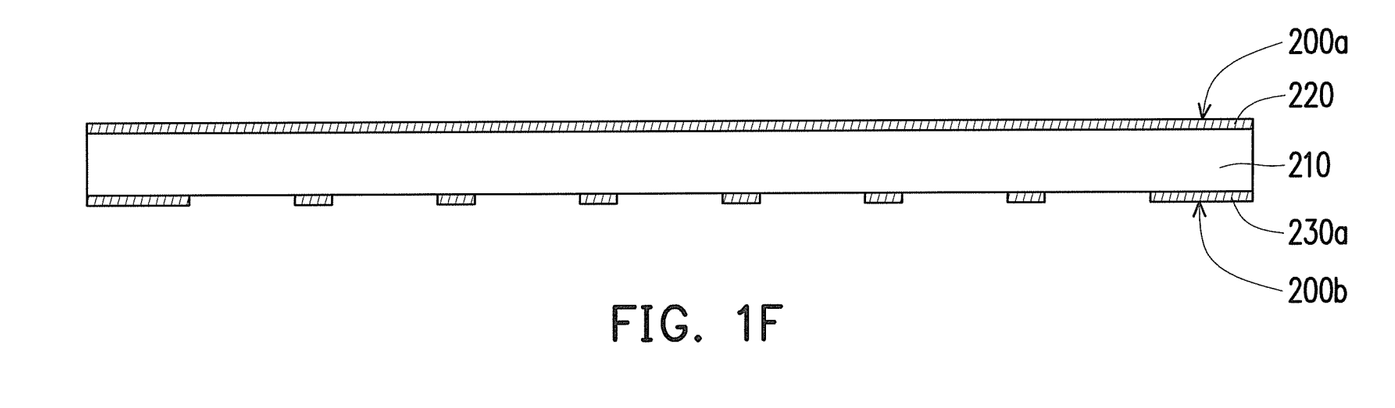
Figure 1G:
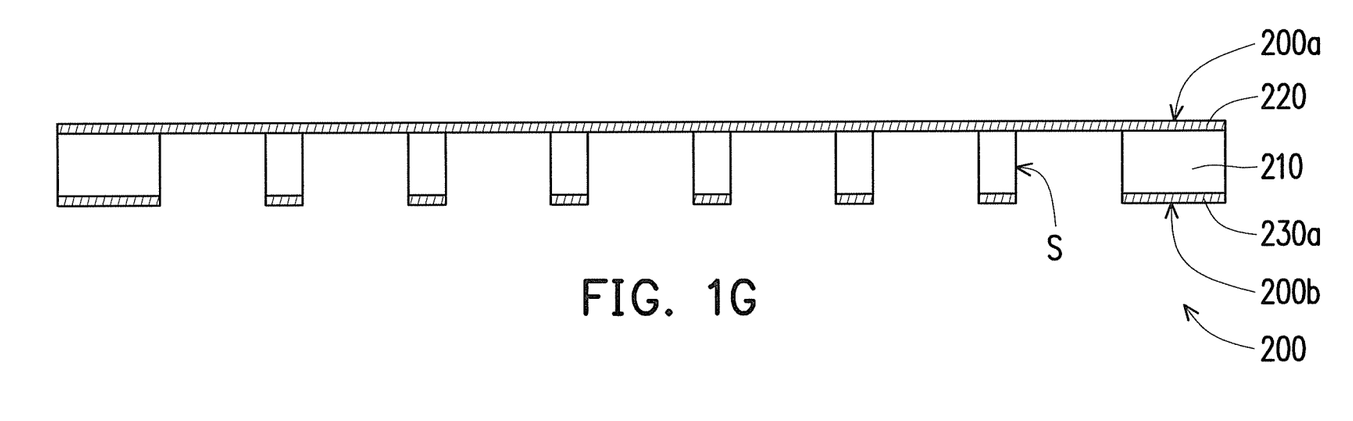
Figure 1H:
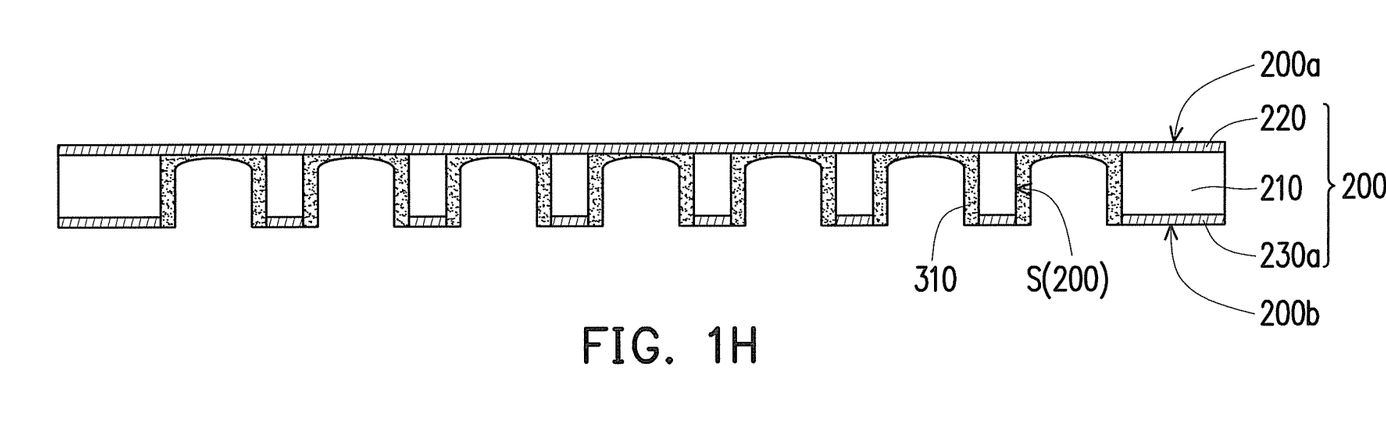
Figure 1I:
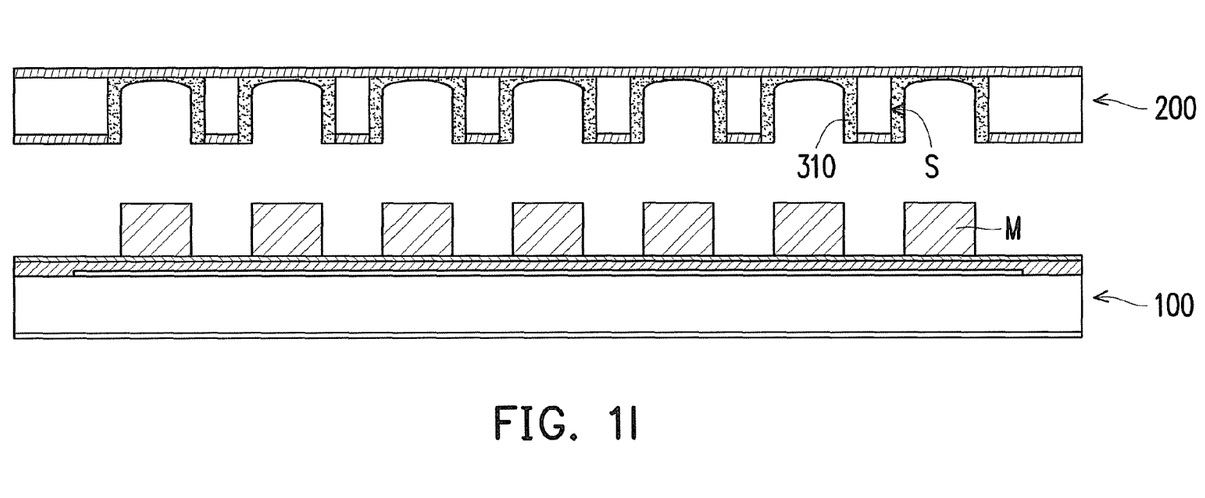
Figure 1J:
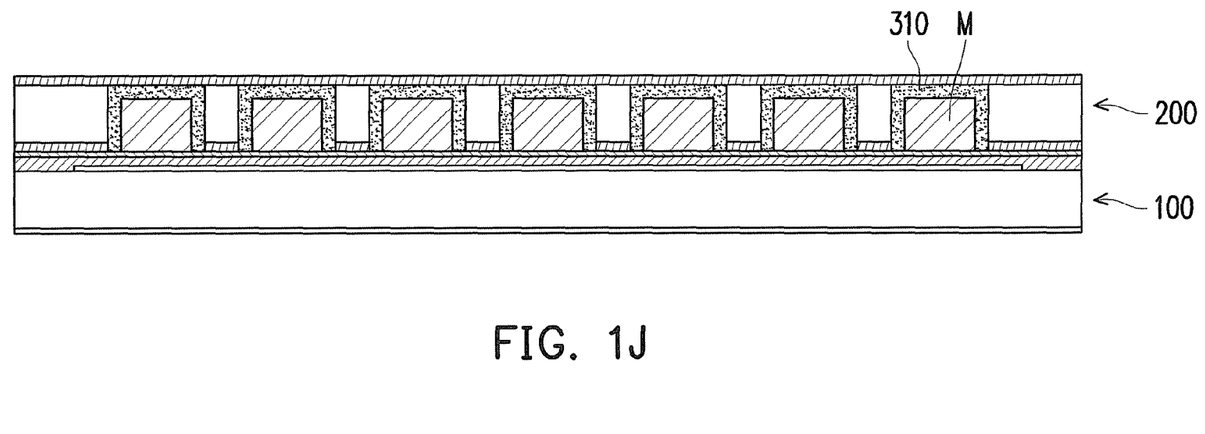
Figure 1K:
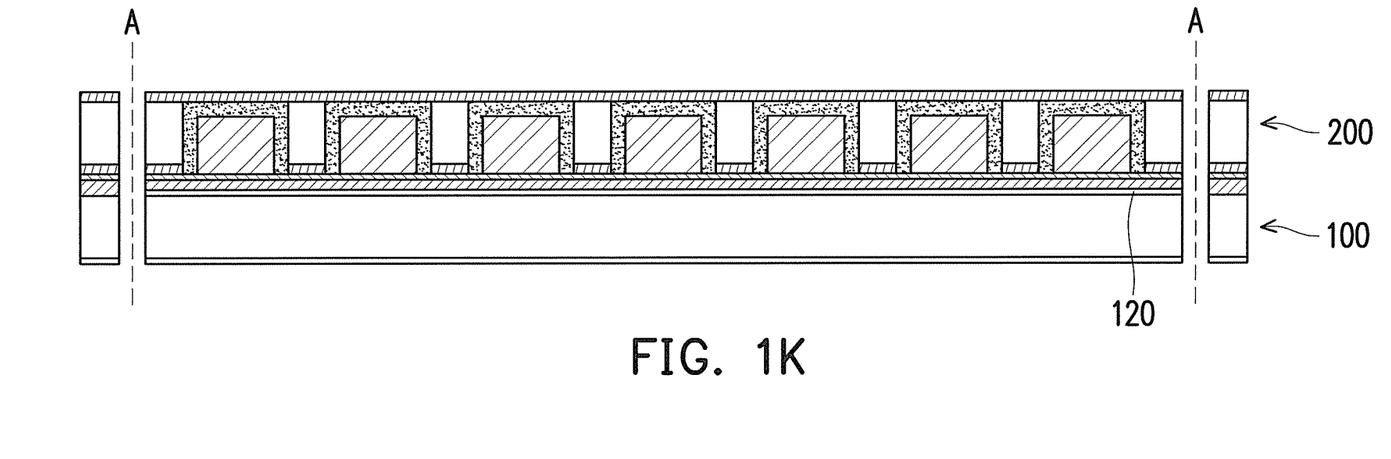
Figure 1L:
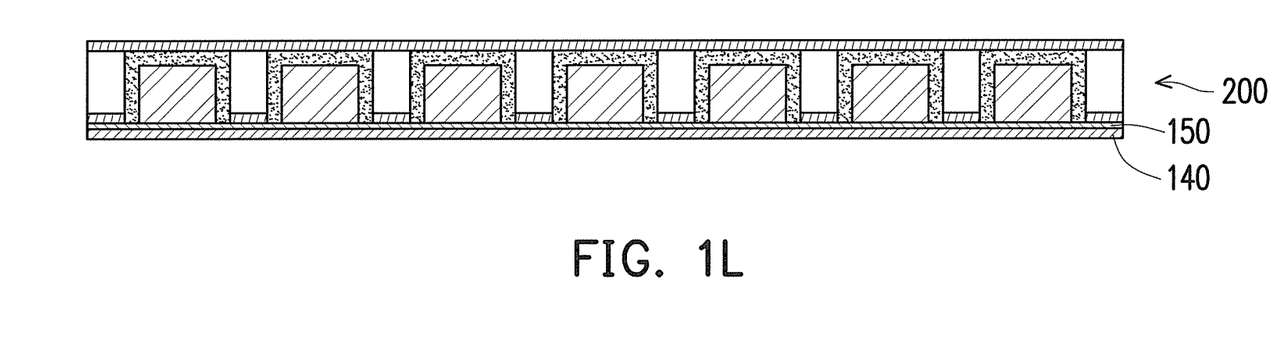
Figure 1M:
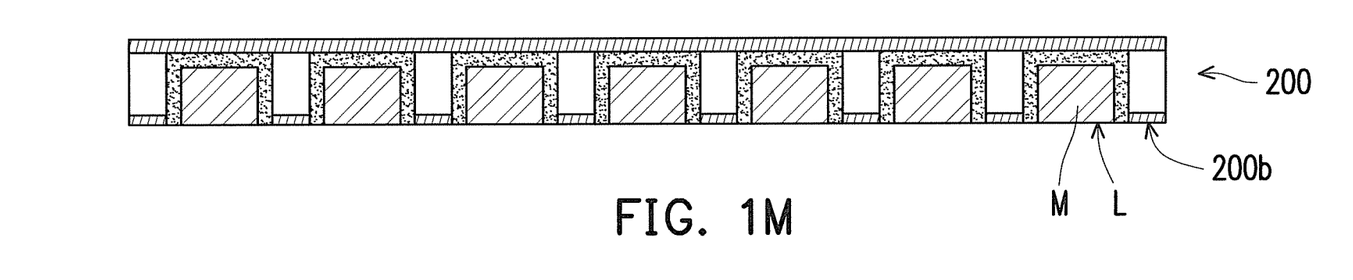
Figure 1N:
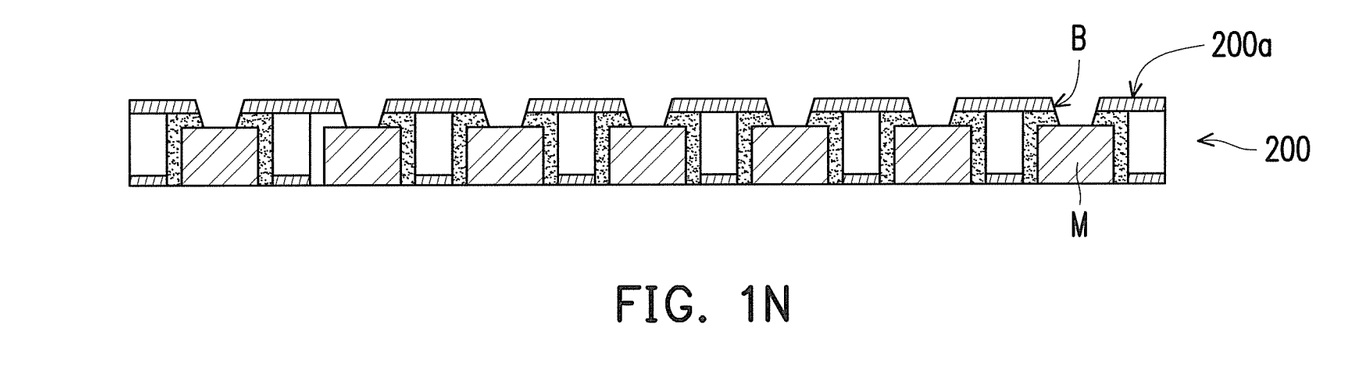
Figure 1P:
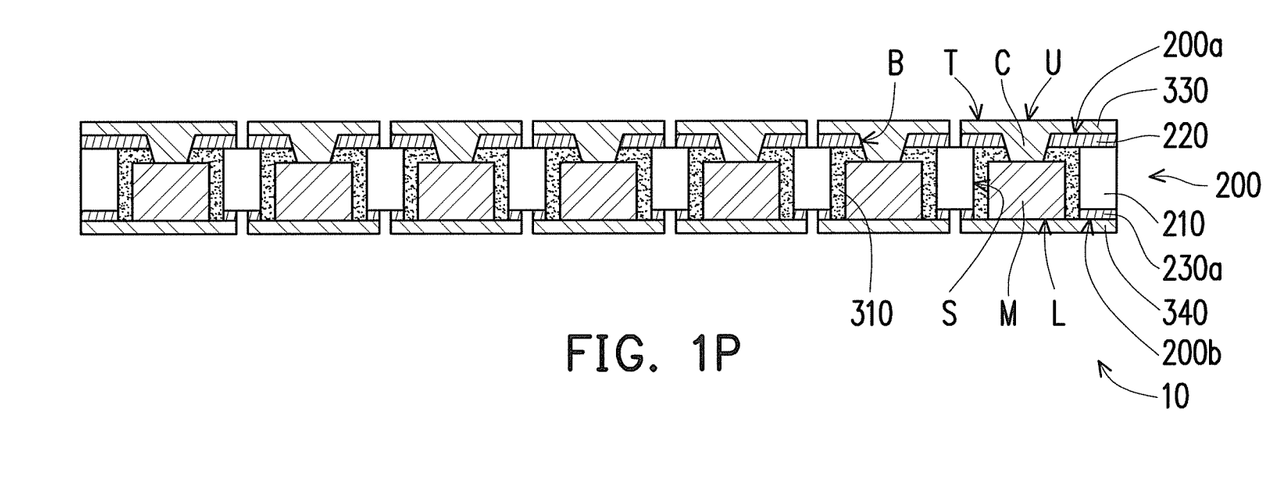

FIG. 1A to FIG. 1P are schematic cross-sectional diagrams illustrating a manufacturing method of a package substrate according to an embodiment of the invention. According to the manufacturing method of the package substrate of the invention, firstly, referring to FIG. 1C, a first base 100 is formed. In detail, the steps of forming the first base 100 are provided as follows. Firstly, referring to FIG. 1A, a dielectric layer 110, a first release film 120, a second release film 130 and a copper layer 140 are provided. Next, referring to FIG. 1B, the dielectric layer 110, the first release film 120, the second release film 130 and the copper layer 140 are laminated by hot pressing, wherein the first release film 120 and the second release film 130 are respectively located at two side surfaces of the dielectric layer 110 that are opposite to each other, and the copper layer 140 is located on the first release film 120 and covers the first release film 120 and parts of the front side of the dielectric layer 110. As shown in FIG. 1B, the second release film 130 completely covers the back side of the dielectric layer 110, and the first release film 120 does not completely cover the front side of the dielectric layer 110; and the aim of this to provide align marks in the subsequent substrate disassembly. Afterwards, referring to FIG. 1C, a nickel layer 150 is formed on the copper layer 140, wherein the nickel layer 150 covers the copper layer 140, so as to form the first base 100. Herein, the method of forming the nickel layer 150 is, for example, plating, but the invention is not limited thereto.

Next, referring to FIG. 1D, a plurality of metal bumps M is formed on the first base 100 by plating, wherein the metal bumps M expose parts of the first base 100. In detail, in the present embodiment, the step of forming the metal bumps M includes: firstly, using the nickel layer 150 as a plating seed layer, so as to form a plated metal layer (not shown) by plating; next, forming a photoresist layer (not shown) on the plated metal layer, and forming a patterned photoresist layer (not shown) through exposing and developing. Now, the patterned photoresist layer is formed on the plated metal layer, and thus the patterned photoresist layer can be used as an etching mask, so that the plated metal layer may be etched to form the metal bumps M. Afterward, the patterned photoresist layer is removed, and thereby completes the formation of the metal bumps M. Herein, the formed metal bumps M are located on the nickel layer 150 and expose parts of the nickel layer 150.

Next, referring to FIG. 1G, a second base 200 is provided. In detail, referring to FIG. 1E, the step of forming the second base 200 includes: providing a core dielectric layer 210, a first copper foil layer 220 and a second copper foil layer 230, wherein the first copper foil layer 220 and the second copper foil layer 230 are respectively located on two side surfaces of the core dielectric layer 210 that are opposite to each other, the first copper foil layer 220 has an upper surface 220a, and the second copper foil layer 230 has a lower surface 200b. Next, referring to FIG. 1F, a patterned photoresist layer (not shown) is formed on the second copper foil layer 230, and the patterned photoresist layer is being used as an etching mask to form a second copper foil layer 230a. Afterward, referring to FIG. 1G, using the second copper foil layer 230a as a laser mask, a plurality of containing cavities S formed by lasering the core dielectric layer 210. Herein, the containing cavities S extend from the lower surface 200b and pass through the second copper foil layer 230a and core dielectric layer 210 so as to expose parts of the first copper foil layer 220. At this point, the manufacturing of the second base 200 is completed.

In simple terms, the second base 200 is constituted by the core dielectric layer 210, the first copper foil layer 220 and the second copper foil layer 230a, wherein the upper surface of the second base 200 is namely the upper surface 200a of the first copper foil layer 220, the lower surface of the second base 200 is namely the of the lower surface 200b of the second copper foil layer 230a, and the second base 200 has the containing cavities S, which extend from the lower surface 200b and pass through the second copper foil layer 230a and the core dielectric layer 210 so as to expose parts of the first copper foil layer 220.

Next, referring to FIG. 1H, an adhesive layer 310 is formed on inner walls of the containing cavities S. Herein, because of capillarity phenomenon, the adhesive layer 310 is disposed arcuately on the inner walls of the containing cavities S.

Next, referring to FIG. 1I and FIG. 1J at the same time, the second base 200 is being placed above the first base 100, and then the first base 100 and the second base 200 are laminated by hot pressing, so that the metal bumps M are being accommodated in the containing cavities S, and the metal bumps M are fixed within the containing cavities S through the adhesive layer 310. Herein, as shown in FIG. 1J, the metal bumps M are directly in contact with the adhesive layer 310 and are entirely and tightly located within the containing cavities S.

Next, referring to FIG. 1K, a substrate disassembly is performed, so as to cut the first base 100 and the second base 200 along cutting lines A. Herein, the locations of the cutting lines A are at the edges of the first release film 120 of the first base 100.

Next, referring to FIG. 1M, the first base 100 is removed. In detail, the step of removing the first base 100 includes: firstly, referring to FIG. 1K and FIG. 1L, separating the first release film 120 from the first metal layer 140 through a peeling procedure; next, referring to FIG. 1M, removing the copper layer 140 and the nickel layer 150 through an etching procedure, so as to expose bottom surfaces L of the metal bumps M and the lower surface 200b of the second base 200.

Herein, the bottom surface L of each of the metal bumps M substantially flushes with the lower surface 200b of the second base 200.

Next, referring to FIG. 1N, a plurality of blind via holes B extending from the upper surface 200a of the second base 200 to the metal bumps M is formed. Herein, the method of forming the blind via holes B is, for example, laser ablation, and thus each blind via hole B can be considered as a laser blind via hole.

Then, referring to FIG. 1O, a conductive material layer 320 is formed on the first copper foil layer 220 and the second copper foil layer 230a, wherein the conductive material layer 320 covers the first copper foil layer 220, the second copper foil layer 230a and the bottom surfaces L of the metal bumps M, and the conductive material layer 320 fills the blind via holes B to define a plurality of conductive through via holes C. Herein, the step of forming the conductive material layer 320 includes: using the first copper foil layer 220 and the second copper foil layer 230a as the plating seed layers, so as to form the conductive material layer 320 by plating.

Finally, referring to FIG. 1P, the conductive material layer 320 is being patterned to form a first patterned metal layer 330 and a second patterned metal layer 340, wherein the first patterned metal layer 330 is located on the first copper foil layer 220 and connected with the conductive through via holes C, the second patterned metal layer 340 is located on the second copper foil layer 230, and the first patterned metal layer 330 and the second patterned metal layer 340 respectively expose parts of the two side surfaces of the core dielectric layer 210. At this point, the manufacturing of the package substrate 10 is completed.

In terms of structure, referring to FIG. 1P, the package substrate 10 of the present embodiment includes the base (namely, the second base 200), the adhesive layer 310, the metal bumps M, the conductive through via holes C, the first patterned metal layer 330 and the second patterned metal layer 340. The base 200 has the upper surface 200a and the lower surface 200b that are opposite to each other, the core dielectric layer 210, the first copper foil layer 220, the second copper foil layer 230a and the containing cavities S. The first copper foil layer 220 and the second copper foil layer 230a are respectively located on the two side surfaces of the core dielectric layer 210 that are opposite to each other, and the containing cavities S extend from the lower surface 200b and pass through the second copper foil layer 230a and the core dielectric layer 210 so as to expose parts of the first copper foil layer 220. The adhesive layer 310 is disposed on the inner walls of the containing cavities S.

Furthermore, the metal bumps M are respectively disposed in the containing cavities S, wherein the metal bumps M are fixed within the containing cavities S through the adhesive layer 310, and the bottom surface L of each of the metal bumps M substantially flushes with the lower surface 200b of the base 200. The conductive through via holes C pass through the first copper foil layer 220 and extend to the metal bumps M. The first patterned metal layer 330 covers the first copper foil layer 220 and is connected with the conductive through via holes C. The second patterned metal layer 340 covers the second copper foil layer 230 and the bottom surfaces L of the metal bumps M, wherein the first patterned metal layer 330 and the second patterned metal layer 340 respectively expose parts of the two side surfaces of the core dielectric layer 210. Herein, as shown in FIG. 1P, an upper surface U of each of the conductive through via holes C substantially flushes with a top surface T of the first patterned metal layer 330. The metal bumps M are connected with the corresponding conductive through via holes C and the second patterned metal layer 340. In other words, the metal bumps M are embedded within the second base 200.

Since the present embodiment firstly forms the metal bumps M on the first base 100 by plating, next provides the second base 200 having the containing cavities S, then assembles the first base 100 having the metal bumps M formed thereon with the second base 200 having the containing cavities S by laminating, and finally removes the first base 100 and arranges the circuit layout of the elements on the second base 200, so as to form the package substrate 10 embedded with metal bumps M, as compared to the conventional substrate embedded with copper bumps, which requires to laser cut a copper plate into small copper bumps, the method of forming the metal bumps M as provided in the present embodiment can effectively lowering the production coast of the package substrate 10, and can also effectively reduce the manufacturing time of the package substrate 10. Furthermore, by disposing the adhesive layer 310 in the containing cavities S of the second base 200 and enabling the metal bumps M to be fixed within the containing cavities S through the adhesive layer 310, the structural reliability of package substrate 10 may effectively be provided. In addition, after the metal bumps M are embedded within the second base 200, the first base 100 is removed, and thereby effectively lowering an overall thickness of the package substrate 10.

Figure 2:
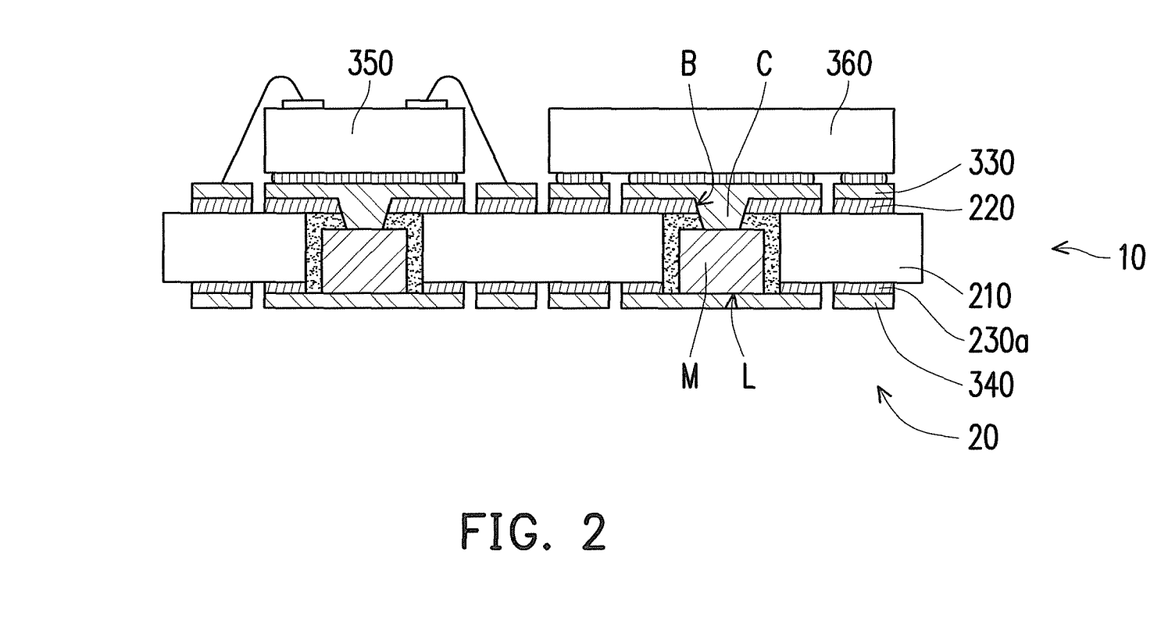
FIG. 2 is a schematic cross-sectional diagram illustrating at least one chip being disposed on the package substrate of the invention.

In the subsequent application of the package substrate 10, referring to FIG. 2, a chip 350 can be electrically connected with the package substrate 10 of the present embodiment by wire bonding, or a chip 360 can be electrically connected with the package substrate 10 by flip-chip bonding, so as to from the so-called package structure 20. Now, thermal energy being generated during the operation of the chip 350 and the chip 360 can directly be transferred to the outside sequentially through the first patterned metal layer 330, the conductive through via holes C, the metal bumps M and the second patterned metal layer 340 of the package substrate 10, thereby providing favorable heat dissipating effect.

In summary, the invention firstly forms the metal bumps on the first base by plating, and then laminate the first base having the metal bumps formed thereon with the second base having the containing cavities, so as to form the substrate embedded with metal bumps. As compared to the conventional substrates embedded with copper bumps, which requires to laser cut a copper plate into small copper bumps, the manufacturing method of the package substrate provided in the invention can effectively lower the manufacturing cost and save the manufacturing time. The metal bumps are fixed within the containing cavities through the adhesive layer, and thus can effectively provide the structural reliability of the package substrate. In addition, the thermal energy generated during the operation of the chips can directly be transferred to the outside through the first patterned metal layer, the conductive through via holes, the metal bumps and the second patterned metal layer of the package substrate, thereby providing favorable heat dissipating effect.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package substrate, comprising:

forming a first base;

forming a plurality of metal bumps on the first base by plating, wherein the metal bumps expose parts of the first base;

providing a second base, the second base having an upper surface and a lower surface opposite to each other, a core dielectric layer, a first copper foil layer, a second copper foil layer, and a plurality of containing cavities, wherein the first copper foil layer and the second copper foil layer are respectively located on two side surfaces of the core dielectric layer that are opposite to each other, and the containing cavities extend from the lower surface and pass through the second copper foil layer and the core dielectric layer to expose parts of the first copper foil layer;

forming an adhesive layer on inner walls of the containing cavities;

laminating the first base and the second base, so as to accommodate the metal bumps in the containing cavities, wherein the metal bumps are fixed within the containing cavities through the adhesive layer;

removing the first base, wherein a bottom surface of each of the metal bumps substantially flushes with the lower surface of the second base;

forming a plurality of blind via holes extending from the upper surface of the second base to the metal bumps;

forming a conductive material layer on the first copper foil layer and the second copper foil layer, wherein the conductive material layer covers the first copper foil layer, the second copper foil layer and the bottom surfaces of the metal bumps, and the conductive material layer fills the blind via holes to define a plurality of conductive through via holes; and patterning the conductive material layer to form a first patterned metal layer and a second patterned metal layer, wherein the first patterned metal layer is located on the first copper foil layer and connected with the conductive through via holes, the second patterned metal layer is located on the second copper foil layer, and the first patterned metal layer and the second patterned metal layer respectively expose parts of the two side surfaces of the core dielectric layer.

2. The manufacturing method of the package substrate as recited in claim 1, wherein the step of forming the first base comprises:

providing a dielectric layer, a first release film, a second release film and a copper layer;

laminating the dielectric layer, the first release film, the second release film and the copper layer, wherein the first release film and the second release film are respectively located at two side surfaces of the dielectric layer that are opposite to each other, and the copper layer is located on the first release film; and forming a nickel layer on the copper layer, wherein the nickel layer covers the copper layer to form the first base.

3. The manufacturing method of the package substrate as recited in claim 2, wherein the metal bumps are located on the nickel layer and expose parts of the nickel layer.

4. The manufacturing method of the package substrate as recited in claim 2, wherein the step of forming the metal bumps comprises:

forming the metal bumps by plating, exposing, developing and etching, and by using the nickel layer as a plating seed layer.

5. The manufacturing method of the package substrate as recited in claim 2, wherein the step of removing the first base comprises:

separating the first release film from the first metal layer through a peeling procedure; and removing the copper layer and the nickel layer through an etching procedure, so as to expose the bottom surfaces of the metal bumps and the lower surface of the second base.

6. The manufacturing method of the package substrate as recited in claim 1, wherein each of the blind via holes is a laser blind via hole.

7. The manufacturing method of the package substrate as recited in claim 1, wherein the step of forming the conductive material layer comprises:

using the first copper foil layer and the second copper foil layer as plating seed layers, so as to form the conductive material layer by plating.

8. A package substrate, comprising:

a base, having an upper surface and a lower surface opposite to each other, a core dielectric layer, a first copper foil layer, a second copper foil layer and a plurality of containing cavities, wherein the first copper foil layer and the second copper foil layer are respectively located at two side surfaces of the core dielectric layer that are opposite to each other, and the containing cavities extend from the lower surface and pass through the second copper foil layer and the core dielectric layer to expose parts of the first copper foil layer;

an adhesive layer, disposed on inner walls of the containing cavities;

a plurality of metal bumps, respectively disposed within the containing cavities, wherein the metal bumps are fixed with in the containing cavities through the adhesive layer, and a bottom surface of each of the metal bumps substantially flushes with the lower surface of the base;

a plurality of conductive through via holes, passing through the first copper foil layer to extend to the metal bumps;

a first patterned metal layer, covering the first copper foil layer and connected with the conductive through via holes; and a second patterned metal layer, covering the second copper foil layer and the bottom surfaces of the metal bumps, wherein the first patterned metal layer and the second patterned metal layer respectively expose parts of the two side surfaces of the core dielectric layer.

9. The package substrate as recited in claim 8, wherein an upper surface of each of the conductive through via holes substantially flushes with a top surface of the first patterned metal layer.

10. The package substrate as recited in claim 8, wherein the metal bumps are connected with the corresponding conductive through via holes and the second patterned metal layer.

* * * * *